United States Patent [19]
Liou et al.

[11] Patent Number: 6,150,274
[45] Date of Patent: Nov. 21, 2000

[54] METHOD OF ENHANCING CMP REMOVAL RATE OF POLYMER-LIKE MATERIAL AND IMPROVING PLANARIZATION IN INTEGRATED CIRCUIT STRUCTURE

[75] Inventors: Ping Liou; Hao-Chich Yung, both of Hsinchu, Taiwan

[73] Assignee: Winbond Electronics Corp., Hsinchu, Taiwan

[21] Appl. No.: 09/304,474

[22] Filed: May 3, 1999

[51] Int. Cl.$^7$ ...................................................... H01L 21/47
[52] U.S. Cl. ............................................ 438/692; 438/623
[58] Field of Search ..................................... 438/692, 725, 438/623, FOR 389, FOR 395

[56] References Cited

U.S. PATENT DOCUMENTS 5,976,979  11/1999  Chen .

*Primary Examiner*—George Fourson
*Assistant Examiner*—Barbara Elizabeth Abbott
*Attorney, Agent, or Firm*—W. Wayne Liauh

[57] ABSTRACT

A method for planarizing the surface of a semiconductor wafer is disclosed. It involves the steps of: (a) applying a coating solution containing a polymeric material on a semiconductor wafer having a non-planar surface; (b) curing the polymeric material to cause the polymeric material to become a hardened polymeric material; (c) subjecting the hardened polymeric material to a $N_2O$ gas plasma treatment, so that an outer portion of the hardened polymeric material can be polished by a conventional CMP slurry which is typically intended for polishing silicon oxide; and (d) polishing the $N_2O$ gas plasma treated polymeric material using a conventional CMP slurry. This method allows conventional CMP slurries to be used for the chemical-mechanical polishing of the chemically more inert polymeric material, thus eliminating stocking and potential compatibility problem. It also advantageously allows the unaffected portion of the polymeric material to serve as a self-provided etch stop.

8 Claims, 3 Drawing Sheets

METHOD OF ENHANCING CMP REMOVAL RATE OF POLYMER-LIKE MATERIAL AND IMPROVING PLANARIZATION IN INTEGRATED CIRCUIT STRUCTURE

FIELD OF THE INVENTION

The present invention relates to an improved method for carrying out chemical-mechanical polishing (CMP) operations during the fabrication of very high integrated circuits (VLSI) or ultra-high integrated circuits (ULSI). More specifically, the present invention relates to an improved method for performing chemical-mechanical polishing (or planarization) operations which enhances the CMP removal rate when a non-conventional polymer-like-spin-on-glass (SOG) material is used as the filling (i.e., sacrificing) material to provide a planarized interconnection layer. The method disclosed in the present invention also eliminates those problems associated with the incomplete removal of the sacrificing material, including vias poisoning, which can cause very high electrical resistance through the interlayer vias.

BACKGROUND OF THE INVENTION

One of the main recent trends in the fabrication of ultra-large scale-integration (ULSI) circuits is the vertical stacking, or integration, of metal wiring circuits to form multilevel interconnection. Multilevel fabrication process has become an efficient way to increase circuit performance and increase the functional complexity of the circuits. One drawback of multilevel interconnection is the loss of topological planarity resulting from various photolithographic and etching processes. The various integrated circuit fabrication processes invariably produce nonplanar surface, or nonplanar topography, on the wafer, from which semiconductor devices are fabricated. During the multilevel metallization of VLSI or ULSI devices, the multiplicity of layers of nonplanar surfaces further add together to produce very serious topography problems. For example, the conductive or insulative properties of the various deposited films can be degraded on the area of the film layers across the step height. Those films in high topography areas can be easily broken during heat, electrical current, or mechanical stress steps, resulting in the pattern areas becoming discontinuous. Such discontinuity can cause the device to fail to perform its intended function. Furthermore, a nonplanar surface cannot be precisely focused during the photolithography process, because the depth of focus of the conventional photolithographic stepper will be deviated by different step heights of the wafer. Such an out-of-focus problem is more profound with device features of very small sizes.

To alleviate these problems, the wafer is planarized at various stages in the fabrication process to minimize nonplanar topography and thus its adverse effects. Such planarization is typically implemented in the dielectric layers. However, it is possible to implement the planarization process in the conductor layer. One of the commonly used planarization processes is an SOG (spin-on-glass) process. More recently, chemical-mechanical polishing (CMP) processes have become very well received to planarize the wafer surface in preparation for further device fabrication. The CMP process mainly involves the step of holding a semiconductor wafer against a rotating polishing pad surface wetted by a polishing slurry, which typically comprises an acidic or basic etching solution in combination with alumina or silica particles. On the one hand, the liquid portion of the slurry chemically removes, loosens, or modifies the composition of the material on the wafer which is to be removed. On the other hand, the particle portion of the slurry, in combination of the rotating polishing pad, physically removes the chemical modified material from the wafer. Thus, the name "chemical-mechanical polishing" was obtained.

One of the sacrificial materials in the ULSI processes is a solution-type silicon dioxide, which is commonly referred to as the spin-on-glass (SOG). SOG is initially formed as a low viscosity solution which can be coated onto the nonplanar surface to quickly fill the recessed areas by a conventional spin coating technique. After the SOG coating, the coated layer is hard-baked to remove the solvent contained therein and turn the SOG layer into a hardened layer. Because of its high electrical resistance, the solidified SOG layer on top of the integrated circuit structure (i.e., the metal layer) must be etched back, conventionally by a dry (plasma) etch process involving fluoride gas in the reactive plasma chamber. If the SOG layer on the top surface of the wafer is not completely removed, it can generate the so-called vias poisoning, causing the vias to have a very high electrical resistance and adversely affect the interlayer conduction.

Conventional silicon oxide based SOG material have exhibited several disadvantages if they are used in CMP process. Polymer-based SOG materials offer many advantages. However, the polymer-based sacrificial material is not considered as a CMP sacrificial material because it exhibits a very low CMP removal rate using CMP slurries designed for conventional oxides. Thus, the IC manufacturers must stock two different types of chemical-mechanical polishing slurries. And the use of a different chemical-mechanical polishing slurry may cause material compatibility problems and other handling concerns.

SUMMARY OF THE INVENTION

The primary object of the present invention is to develop an improved chemical-mechanical polishing (CMP) method for the fabrication of multilayer semiconductor devices on a substrate. More specifically, the primary object of the present invention is to develop an improved CMP process with enhanced CMP polishing (i.e., removal) rate when an alternate sacrificing composition, such as a polymer-based material, is used as a filler material to fill the gaps of various trenches, using the same kind of slurry used in the chemical-mechanical polishing of silicon dioxide.

In the method disclosed in the present invention, a polymeric material, such as polyimide, is used as the sacrificial material for chemical-mechanical polishing operations. The polymeric material so selected should exhibit, in addition to excellent gap-filling ability, excellent electrical resistance, chemical resistance and mechanical properties after it is cured. One of the key elements of the present invention is that, after the polymeric material is coated on the wafer surface and cured, it will be subject to an $N_2O$ or other plasma treatment so that it can be easily removed by conventional oxide-type chemical-mechanical polishing slurries, such as potassium hydroxide-stabilized slurry with fused silica. By using the $N_2O$ plasma treated polymeric material as the sacrificing material before the chemical-mechanical polishing process, many advantages of using the polymeric material can be realized with substantially enhanced CMP removal rate.

In summary, the method disclosed in the present invention comprises the following steps, which are part of the overall process in fabricating a semiconductor device;

(1) applying a coating solution containing a polymeric material on a semiconductor wafer having a non-planar surface such as gaps or trenches;

(2) curing said polymeric material to cause said polymeric material to become a hardened polymeric material;

(3) subjecting said hardened polymeric material to an $N_2O$ plasma treatment; and (4) using a chemical-mechanical polishing (CMP) process to remove the $N_2O$ plasma treated polymeric material utilizing an oxide-type CMP slurry (i.e., a conventional CMP slurry that is effective in polishing the oxide-type sacrificial material).

The method disclosed in the present invention substantially enhances the CMP removal (i.e., polishing) rate of the polymeric material using conventional CMP slurries developed for oxides.

BRIEF DESCRIPTION OF THE DRAWING

The present invention will be described in detail with reference to the drawing showing the preferred embodiment of the present invention, wherein:

FIG. 1A shows that a conventional silicon oxide SOG-based sacrificial layer was formed on a non-planar surface of a semiconductor wafer.

FIG. 1B shows that a different type of non-planar topography is developed after the chemical-mechanical polishing process on the conventional silicon oxide SOG-based sacrificial layer.

FIG. 2A shows that a hardened polymeric material based sacrificial layer was formed on the non-planar surface of a semiconductor wafer.

FIG. 2B shows a schematic cross-sectional view of the polymer material based sacrificial layer after the $N_2O$ plasma treatment.

DETAILED DESCRIPTION OF THE PREFERRED EMBODIMENT

Figure 1A:
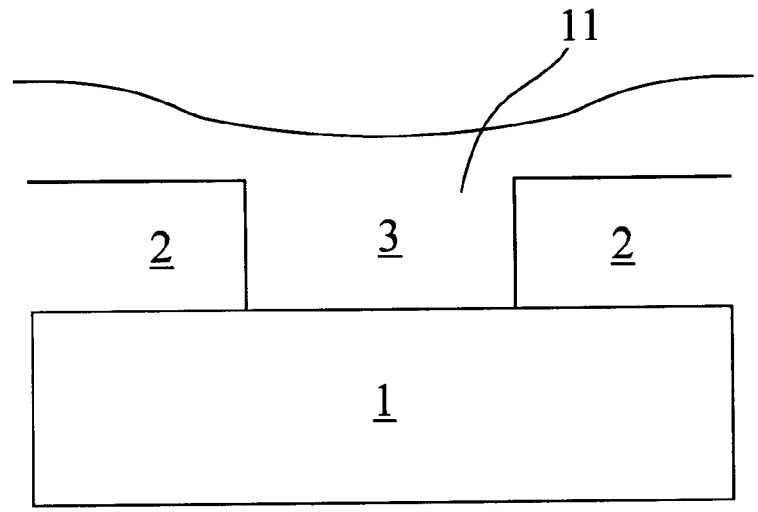
FIGS. 1A through 1B are illustrative schematic drawings showing the various steps of the conventional chemical-mechanical polishing process utilizing a $SiO_2$ based spin-on glass (SOG) as the sacrificial material.

The present invention discloses an improved chemical-mechanical polishing (CMP) method for the fabrication of multilayer semiconductors on a substrate. In the method disclosed in the present invention, an alternate sacrificing composition is utilized as the filler material in place of the conventional silicon oxide but which can be easily polished with CMP polishing slurries typically intended for polishing oxide based filler materials.

In the preferred embodiment of the method disclosed in the present invention, a polymeric material, such as polyimide or polyamideimide, is used as the sacrificial material which is coated to fill in the gaps or trenches before the chemical-mechanical polishing operations. The polymeric material so selected must exhibit excellent gap-filling ability, as well as satisfactory electrical resistance, chemical resistance, and mechanical properties after it is cured.

One of the drawbacks of using the polymeric filler SOG material for CMP operations is that it often exhibits slow CMP removal rate using the CMP slurries intended for oxide based filler materials. In the method disclosed in the present invention, the polymeric material is subject to an $N_2O$ plasma treatment after it is coated on the wafer surface and cured. By subjecting the polymeric material to such $N_2O$ plasma treatment, the hardened polymeric material can be easily removed by conventional oxide-type chemical-mechanical polishing slurries, such as potassium hydroxide-stabilized slurry with fused silica. The use of the $N_2O$ plasma treated polymeric material as the sacrificing material before the chemical-mechanical polishing process allows many advantages of the polymeric material to be realized which also provides substantially enhanced CMP removal rate.

The method disclosed in the present invention for the fabrication of semiconductor devices can be summarized as comprising the following steps:

(1) applying a coating solution containing a polymeric material on a semiconductor wafer having a non-planar surface;

(2) curing said polymeric material to caused said polymeric material to become hardened polymeric material;

(3) subjecting said hardened polymeric material to an $N_2O$ plasma treatment; and (4) polishing said polymeric material using a CMP slurry which is effective also in polishing a silicon oxide based material.

In a preferred embodiment of the present invention, the polymeric material is polyimide. Other polymers such as polyamide, polyamideimide, etc., can also be used in the present invention. The main criteria are that it exhibits low viscosity to allow for spin coating after dissolved into a solvent, and that it can be removed by a conventional oxide-type CMP slurry after being subject to an $N_2O$ plasma treatment. Other plasma gases, such as $N_2$, $O_2$, argon, etc. can also be used in implementing the present invention. The plasma gas treatment can be conducted at a low pressure (in the order of several Torr), and low RF power (preferably in the range of 100 to 300 Watt).

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLES 1–6

Figure 2A:
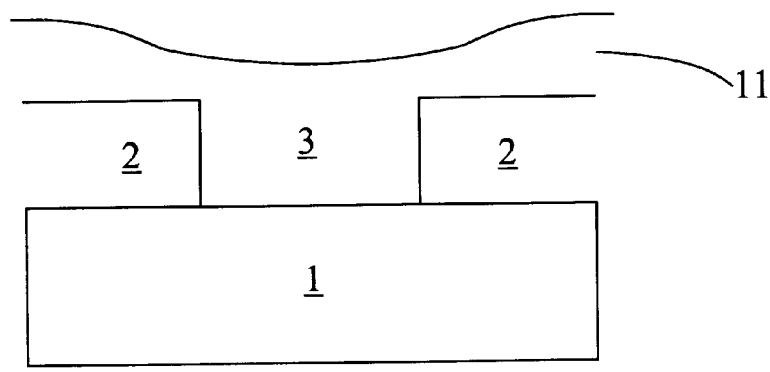
FIGS. 2A through 2B are illustrative schematic drawings showing the various steps of the improved chemical-mechanical polishing process according to a preferred embodiment of the present invention utilizing a polymer based sacrificial material.
Figure 2B:
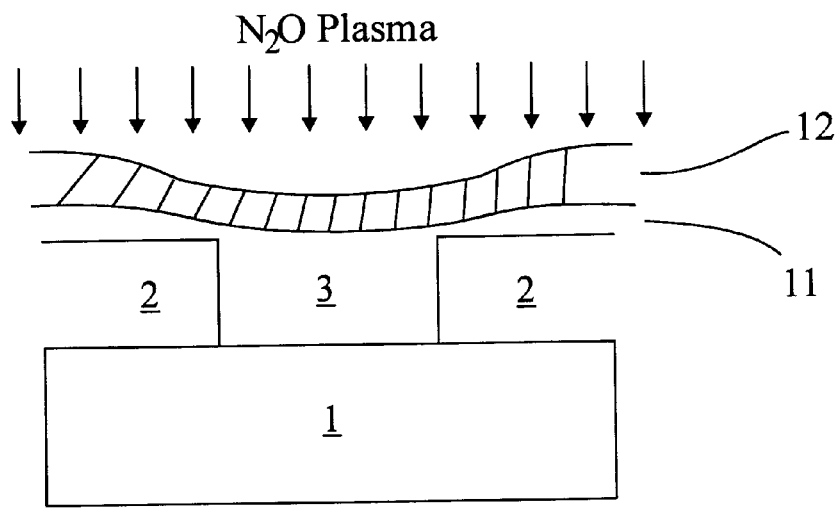

FIGS. 2A through 2B are illustrative schematic drawings showing the main steps of the improved chemical-mechanical polishing process according to a preferred embodiment of the present invention utilizing a polymer based sacrificial material. The polymeric based sacrificial material was polyimide, which exhibited excellent electrical and chemical resistance and the required mechanical properties. In FIG. 2A it is shown schematically that a hardened polyimide-based sacrificial layer 11 was formed on the non-planar surface of a substrate 1, which contained a trench 3 formed in a dielectric layer 2. The polyimide layer was formed by first forming a low viscosity polyimide solution and then coating the polyimide solution on the wafer surface by a spin coating technique. The polyimide sacrificial layer was then subject to the $N_2O$ plasma treatment, as shown in FIG. 2B.

Figure 2C:
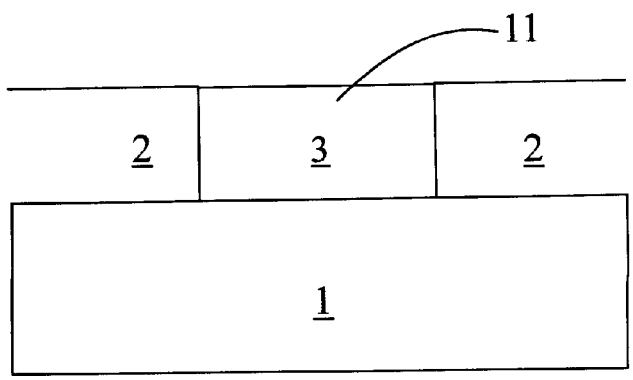
FIG. 2C shows a schematic cross-sectional view of the polymer material based sacrificial layer after the chemical-mechanical polishing process.

FIG. 2C shows a schematic cross-sectional view of the polymer material based sacrificial layer after the chemical-mechanical polishing process. The affected portion of the polyimide layer is shown as a shaded area 12. The $N_2O$ treated portion can be easily removed with a conventional oxide-type CMP slurry, which contains potassium hydroxide-stabilized slurry with fused silica. On the other hand, the unaffected portion of the polyimide layer remained inert to the conventional oxide based CMP slurry. The $N_2O$ treatment is preferably designed such that the affected portion can be effectively and efficiently removed by a subsequent chemical-mechanical polishing process so as to form a planarized surface, while the unaffected portion of the polyimide layer served as a self-provided CMP stop.

Figure 3:
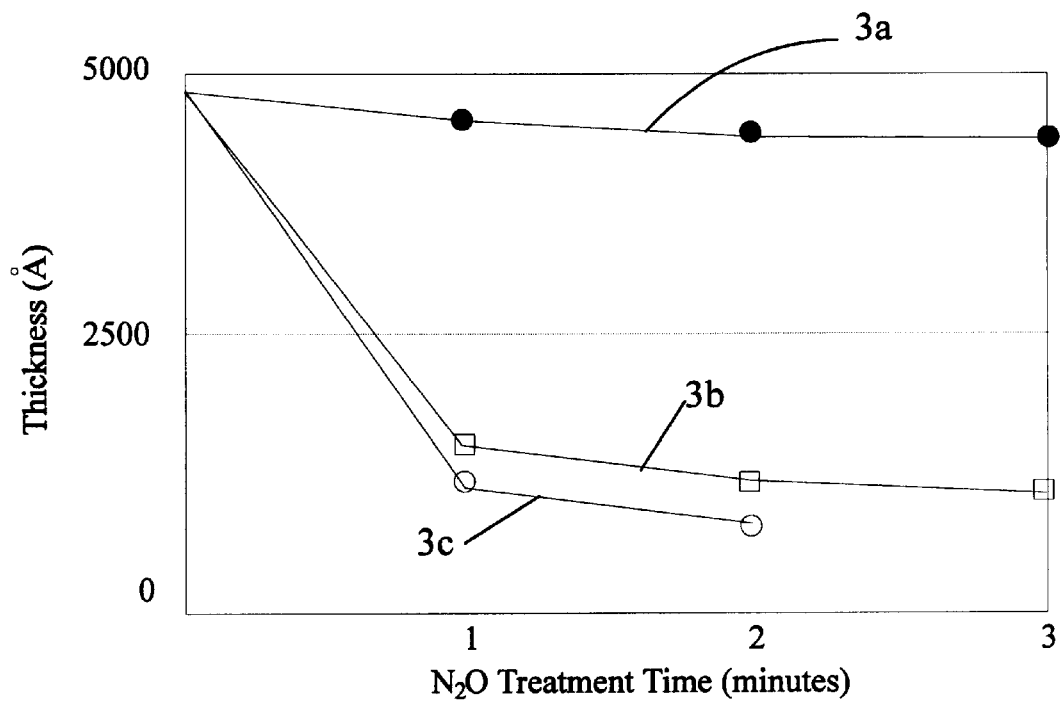
FIG. 3 shows plots of thickness of various polymeric material based sacrificial layers after being dipped in a hydrofluoric acid solution for different durations.

FIG. 3 shows plots of thicknesses vs extent of $N_2O$ treatment of three polymeric material based sacrificial layers after being dipped in a hydrofluoric acid solution for different durations. Curve 3a shows that the thickness of the polymer layer exhibited a slight decrease in thickness after an initial $N_2O$ treatment, but essentially no thickness change after subsequent treatments. Curves 3b and 3c show the thickness reductions as a function of $N_2O$ treatment time after they are dipped in a hydrofluoric acid solution for 30 seconds and 60 seconds, respectively. The concentration of hydrofluoric acid was 1 wt %. Curves 3b and 3c show that the polyimide layer is essentially inert to hydrofluoric acid without $N_2O$ treatment. However, the $N_2O$ treatment greatly enhanced the chemical reactivity of the polymer layer with respect to hydrofluoric acid solution.

Figure 4:
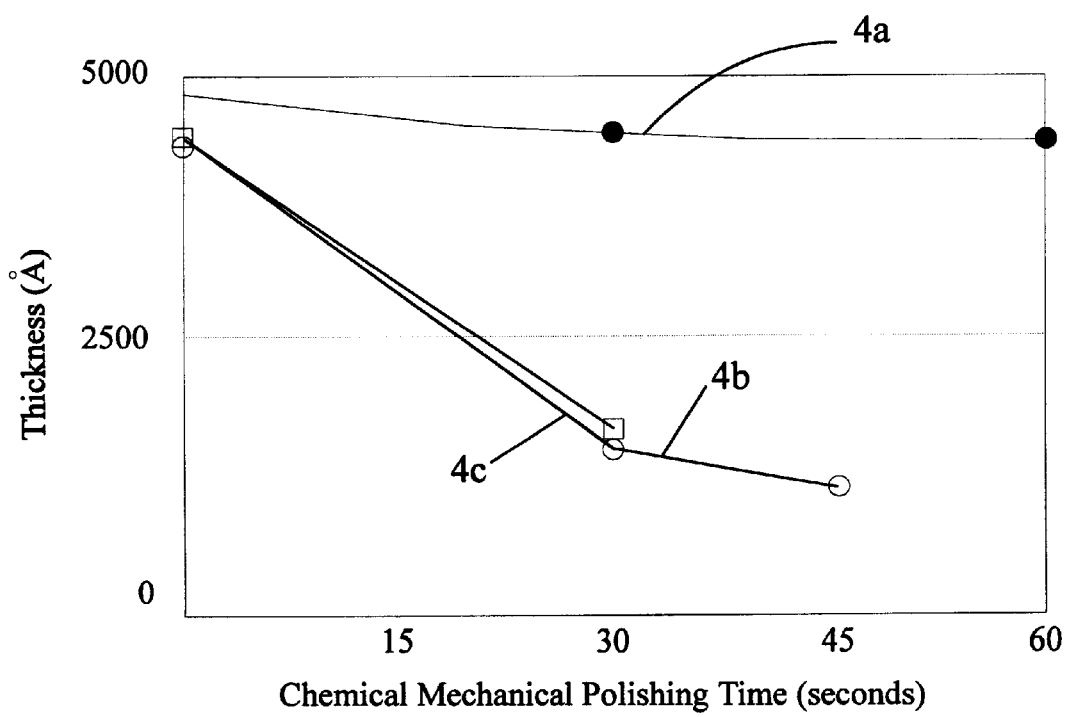
FIG. 4 shows plots of thickness of the various polymeric material based sacrificial layers after chemical-mechanical polishing.

FIG. 4 shows similar plots of thicknesses of three types of polymeric material based sacrificial layers after being subject to a chemical-mechanical polishing process. The first curve 4a, which was not subject to $N_2O$ treatment, showed little thickness change after being subject to the chemical-mechanical polishing process. The concentration of hydrofluoric acid was similarly at 1 wt %. Curves 4b and 4c are the plots of the thicknesses of the polyimide layers vs. chemical-mechanical polishing time for the polyimide layers that had been subject to $N_2O$ plasma treatment for 30 seconds and 60 second, respectively. Both curves 4b and 4c clearly demonstrate the effectiveness of $N_2O$ plasma treatment in enhancing the CMP removing rate of polymer-based sacrificial layers.

As discussed earlier, the method disclosed in the present invention allows conventional CMP polishing slurries that are typically intended for use with silicon oxide based sacrificial materials to be used for polymer-based sacrificial layers. As a result, the method disclosed in the present invention substantially improves the degree of planarization of the chemical-mechanically polished wafer surface by allowing the use of improved non-oxide-based sacrificial materials, without sacrificing CMP removal rate or having to resort to the use of other types of CMP slurries which could result in substantially increased manufacturing cost.

COMPARATIVE EXAMPLE 1

Figure 1B:
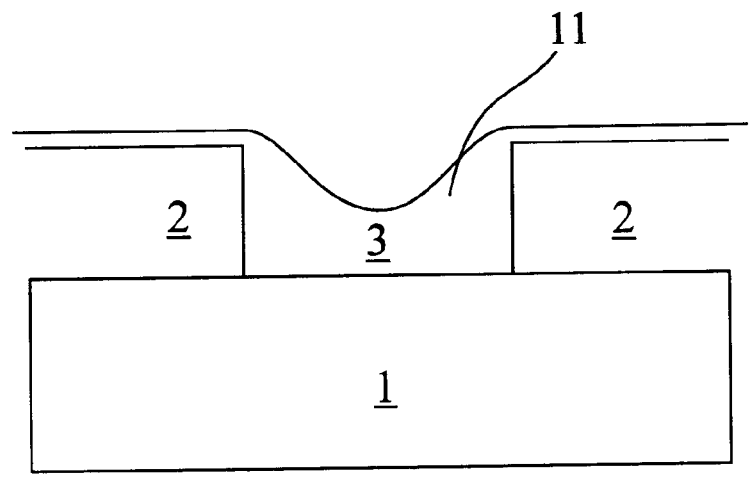

FIG. 1A shows that a conventional silicon oxide SOG-based sacrificial layer 11 was formed on a non-planar surface of a semiconductor wafer 1 to fill in a gap 3 between two active regions 2. FIG. 1B shows that a different type of non-planar topography is left after the chemical-mechanical polishing process on the conventional silicon oxide SOG-based sacrificial layer. The new non-planar topography was formed due to the dishing effect, by which the SOG material in the trench region was etched away by the hydrofluoric acid contained in the chemical-mechanical polishing slurry. Under certain conditions, the final surface can be more non-planar than the original surface before polishing. This illustrated why the conventional SOG process is not considered by the semiconductor manufacturing industry for CMP planarization processes.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for planarizing a surface of a semiconductor wafer comprising the steps of:

(a) applying a coating solution containing a polymeric material on a semiconductor wafer having a non-planar surface, said polymeric material being selected from the group consisting of polyimide, polyamide, and polyamideimide;

(b) curing said polymeric material to cause said polymeric material to become a hardened polymeric material;

(c) subjecting said hardened polymeric material to a gas plasma treatment; and (d) polishing said gas plasma treated polymeric material using a chemical-mechanical polishing (CMP) process.

2. The method for planarizing a surface of a semiconductor wafer according to claim 1 wherein said gas plasma is selected from the group consisting of $N_2O$, $N_2$, $O_2$, and argon plasma.

3. The method for planarizing a surface of a semiconductor wafer according to claim 1 wherein said gas plasma is $N_2O$ plasma.

4. The method for planarizing a surface of a semiconductor wafer according to claim 1 wherein said gas plasma is generated at a pressure of several torr and a radio frequency power in the range of 100 to 300 Watt.

5. The method for planarizing a surface of a semiconductor wafer according to claim 1 wherein said polymeric material is polyimide.

6. The method for planarizing a surface of a semiconductor wafer according to claim 1 wherein said chemical mechanical polishing process utilizes a CMP slurry which is also effective in polishing a silicon oxide material.

7. The method for planarizing a surface of a semiconductor wafer according to claim 6 wherein said CMP slurry contains potassium hydroxide-stabilized slurry with fused silica.

8. The method for planarizing a surface of a semiconductor wafer according to claim 1 wherein said gas plasma treatment is conducted to penetrate a depth in said hardened polymeric material, said depth being deep enough so that an unaffected portion of said hardened polymeric material can serve as CMP polishing stop during said chemical mechanical polishing process.

* * * * *